United States Patent [19]

Inoue

[11] Patent Number: 4,980,734
[45] Date of Patent: Dec. 25, 1990

[54] DYNAMIC MEMORY CELL USING SILICON-ON-INSULATOR TRANSISTOR WITH TRENCH CAPACITOR

[75] Inventor: Shinji Inoue, Houston, Houston, Tex.

[73] Assignee: Texas Instruments Incorporated, Dallas, Tex.

[21] Appl. No.: 455,900

[22] Filed: Dec. 21, 1989

Related U.S. Application Data

[63] Continuation of Ser. No. 200,269, May 31, 1988, abandoned, which is a continuation of Ser. No. 643,583, Aug. 23, 1984, abandoned.

[51] Int. Cl.$^5$ ............................................ H01L 29/78
[52] U.S. Cl. ................................ 357/23.6; 357/59; 357/45; 357/51; 357/71
[58] Field of Search .............. 357/23.6, 59 E, 55, 357/23.7, 45, 47, 51, 71

[56] References Cited

U.S. PATENT DOCUMENTS

| | | | |
|---|---|---|---|
| 4,336,550 | 6/1982 | Medwin | 357/42 |
| 4,353,086 | 10/1982 | Jaccodine et al. | 357/55 X |
| 4,432,006 | 2/1984 | Takei | 357/23.7 |
| 4,467,450 | 8/1984 | Kuo | 365/149 |
| 4,470,062 | 9/1984 | Muramatsu | 357/50 |
| 4,536,785 | 8/1985 | Gibbons | 357/54 |
| 4,686,758 | 8/1987 | Liu et al. | 357/59 E X |

FOREIGN PATENT DOCUMENTS

| | | | |
|---|---|---|---|
| 0085988 | 8/1983 | European Pat. Off. | 357/23.6 |
| 0088451 | 9/1983 | European Pat. Off. | 357/23.6 |
| 0108390 | 5/1984 | European Pat. Off. | 357/23.6 |
| 0167764 | 1/1986 | European Pat. Off. | |
| 59-19366 | 1/1984 | Japan | 357/23.6 |
| 59-19366 | 1/1984 | Japan | 357/23.6 |
| 51-130178 | 11/1986 | Japan | |

OTHER PUBLICATIONS

Jolly, R. et al., "A Dynamic RAM Cell . . . ", *IEEE Elec. Dev. Lett*, vol. EDL-4, No. 1, Jan., 83, pp. 8–11.
Kamins et al., "Hydrogenation of Transistors Fabricated in Polycrystalline-Silicon Films", IEEE Elec Dev Lett, Aug. 1980, pp. 159–161.

*Primary Examiner*—Andrew J. James
*Assistant Examiner*—Sara W. Crane
*Attorney, Agent, or Firm*—James C. Kesterson; James T. Comfort; Melvin Sharp

[57] ABSTRACT

A dynamic read/write memory cell of the one transistor type employs a trench capacitor, and a silicon-on-insulator transistor stacked on top of the capacitor. A very small cell size is provided. The bit line is formed by siliciding the polysilicon which forms the transistor. Field plate isolation isolates one cell from another in an array.

34 Claims, 2 Drawing Sheets

DYNAMIC MEMORY CELL USING SILICON-ON-INSULATOR TRANSISTOR WITH TRENCH CAPACITOR

This is a continuation of application Ser. No. 07/200,269 filed May 31, 1988 now abandoned which is a continuation of application Ser. No. 643,583, filed Aug. 23, 1984, now abandoned.

BACKGROUND OF THE INVENTION

This invention relates to semiconductor memory devices and methods of manufacture, and more particularly to construction of one-transistor dynamic read/write memory cells.

Dynamic read/write memory cells made by the double-level polysilicon N-channel self-aligned process commonly used in the industry for 16K and 64K DRAMs are shown in U.S. Pat. No. 4,388,121, issued to G. R. Mohan Rao, assigned to Texas Instruments. A contactless metal gate cell is shown in U.S. Pat. No. 4,345,364, issued to David J. McElroy, also assigned to Texas Instruments; this contactless cell can be made in higher density, such as needed for 256K and 1-Mbit DRAM devices.

Although these double-level polysilicon cells and contactless cells have proved to be quite successful and many hundreds of millions of memory devices have been made using such prior methods, there is nevertheless a continuing necessity to reduce the cell size, and increase the ratio of the storage capacitance per unit of cell area in dynamic memory cells, especially for the next generation 4-Mbit DRAMs. One improvement to this end has been to form the storage capacitor in a groove or trench so that the surface area of the capacitor is increased without increasing the cell area on the face of the chip; examples of this concept are shown in U.S. Pat. No. 4,225,945, issued to Kuo, or pending application Ser. No. 627,371, filed Jul. 3, 1984 by Baglee, Doering, & Armstrong, both assigned to Texas Instruments.

It is the principal object of this invention to provide an improved dynamic read/write memory cell, particularly of smaller cell size. An additional object is to provide a dense array of dynamic memory cells, made by a more efficient method. A further object is to provide an improved way of making dynamic memory cells.

SUMMARY OF THE INVENTION

In accordance with an illustrative embodiment of the invention a dynamic read/write memory cell of the one transistor type employs a trench capacitor, and a silicon-on-insulator transistor stacked on top of the capacitor. A very small cell size is provided. The bit line is formed by siliciding the polysilicon which forms the transistor. Field plate isolation isolates one cell from another in an array.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
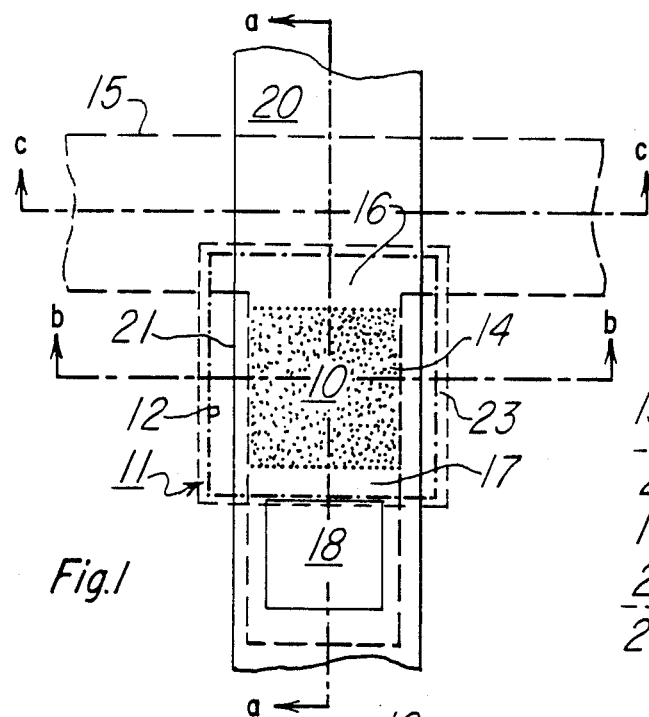
FIG. 1 is a greatly enlarged plan view of a small portion of a semiconductor chip showing the physical layout of a part of a dynamic memory cell made according to the invention.
Figure 2:
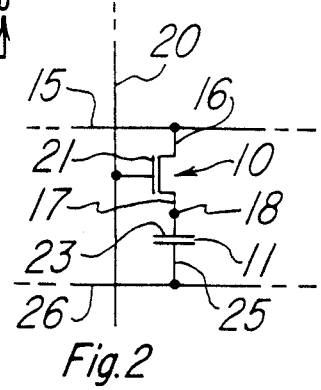
FIG. 2 is an electrical schematic diagram of the cell of FIG. 1.
Figure 3A:
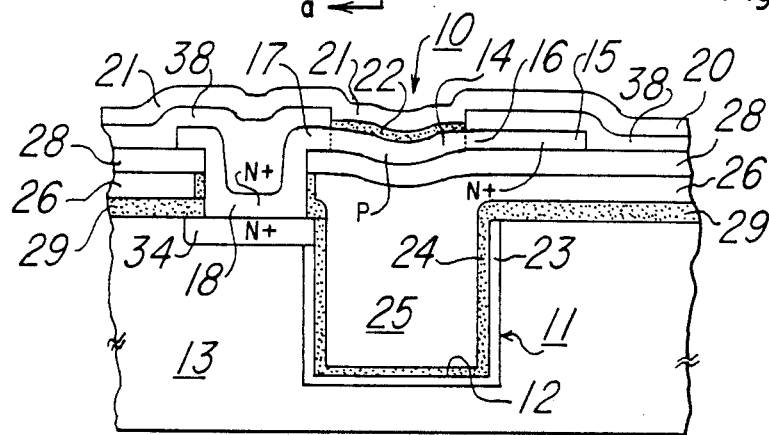
FIGS. 3a-3c are elevation views in section of the cells of FIG. 1, taken along the lines a—a, b—b, and c—c, respectively, in FIG. 1.
Figure 3B:
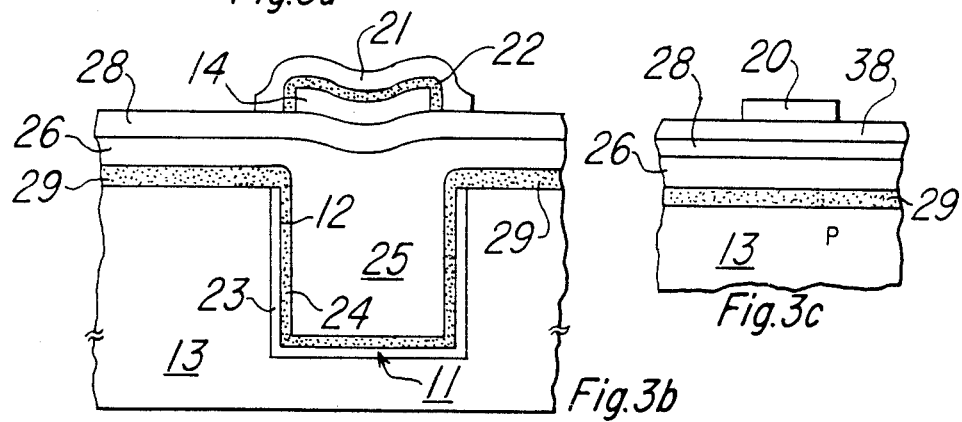
Figure 3C:
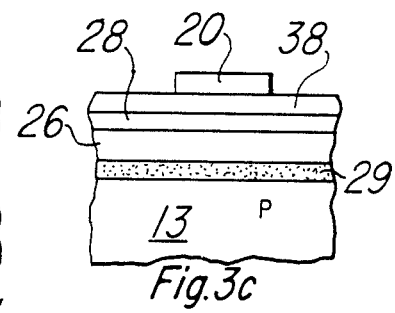

Referring to FIGS. 1, 2 and 3a-3c, a one-transistor dynamic read/write memory cell constructed according to the invention is illustrated. This cell includes an access transistor 10 and a storage capacitor 11, wherein the transistor is a silicon-on-insulator type that is positioned on top of the capacitor, and the capacitor is created in a trench 12 etched into a silicon substrate 13. The transistor 10 has a channel region 14 formed in a layer of polycrystalline (or single-crystalline) silicon which also is silicided to form a bit line 15, a drain region 16, a source region 17 and a contact area 18. A word line 20 extends across the top of the transistor and forms a gate 21 separated from the channel region 14 by thin gate oxide 22. The capacitor 11 includes an N type region 23, diffused into the sidewalls and bottom of the trench 12 to form the lower plate, and uses a thermal oxide coating 24 as a capacitor dielectric. The trench is filled with polycrystalline silicon 25 which also extends across the face of the silicon substrate to create a grounded field plate 26 for isolating one cell from adjacent cells along the face. The contact 18 is formed in a hole 27 etched through the polysilicon field plate 26 and oxide 24, as well as through an interlevel oxide insulator 28 that separates the polysilicon 26 from the overlying transistor. The field plate 26 has a thermal silicon dioxide layer 29 separating it from the silicon substrate 13.

Figure 4A:
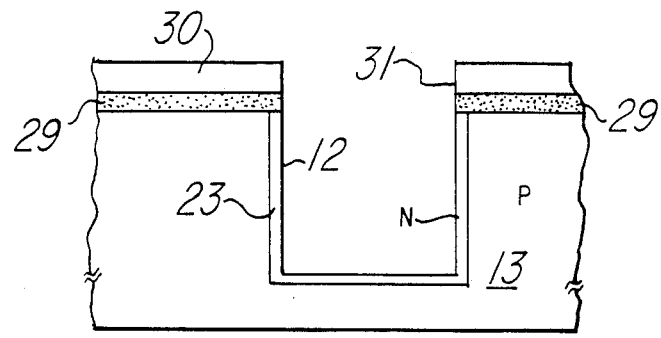
FIGS. 4a-4d are elevation views in section of the cell array of FIGS. 1 and 3a-3c, at successive stages in the manufacturing process, taken generally along the line a—a in FIG. 1.

A method of making the memory cell of FIGS. 1 and 3a-3c will be described with reference to FIGS. 4a-4d. A slice of silicon (containing the substrate 13 as a very small part of it) first has the field oxide 29 grown to a thickness of about 3000 A, then is coated with a masking material 30 as seen in FIG. 4a and an opening 31 is formed where the trench 12 is to be created. An anisotropic etch is performed using a method such as RIE to create the trench 12 to a depth of perhaps 3 microns; the width is about one micron, so the Figures are distorted in the vertical direction, i.e., the trench is much deeper than it is wide. The slice is next exposed to a phosphorus diffusion source at high temperature to create the N type region 23, still using the masking material 30 and oxide 29 to limit the diffusion to only within the trench.

Figure 4B:
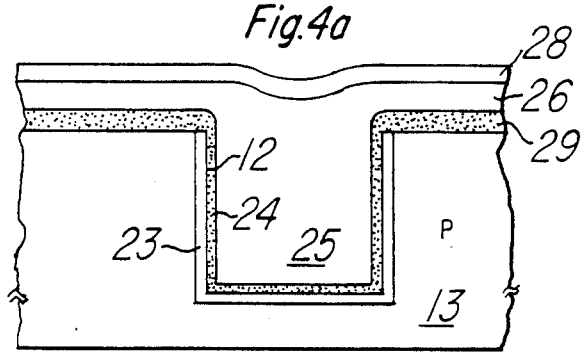

Turning to FIG. 4b, the masking material 30 is removed and the thin oxide coating 24 is grown to about 200 A by exposing an oxidizing atmosphere at high temperature. Then, the polycrystalline silicon 25 and field plate 26 is deposited by a CVD deposition which tends to fill the trench. The next step is growing of the oxide 28, again by thermal oxidation of the polysilicon.

Figure 4C:
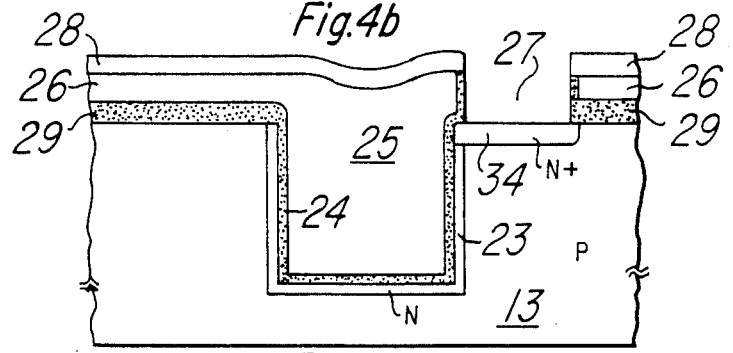

Referring now to FIG. 4c, the hole 27 is now etched for the contact 18. To this end, a photoresist mask is formed to cover the face of the slice except where the hole 27 is to be created. Then a dry etch is performed to remove the exposed oxide 28, then to remove the polysilicon 26. At this point the etch is stopped, and a thermal oxidation performed to oxidize the edges of the polysilicon around the hole, to avoid shorting the contact 18 to the field plate 26. Then an anistropic etch is used to remove the oxide 29 in the bottom of the hole but not in the sidewall. Note that the alignment of the hole 27 is not very critical because if it extends into the polysilicon 25 of the trench it is of no consequence; indeed this is preferred because contact to the region 23 is assured in this manner. Next, an N+ diffusion is performed to create the region 34 which makes connection to the N region 23; this diffusion is masked by the oxide 29.

Figure 4D:
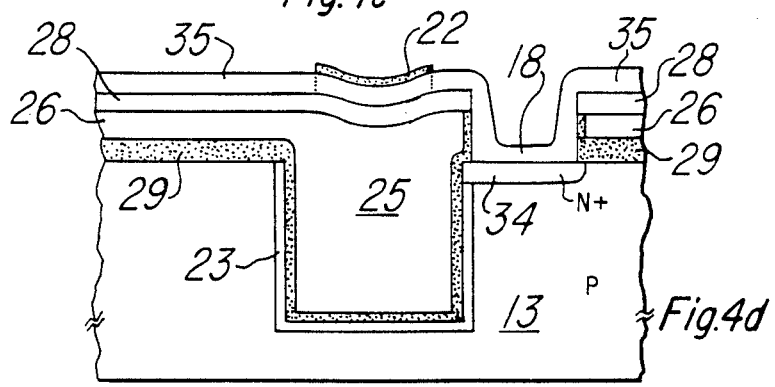

With reference to FIG. 4d, a coating 35 of polycrystalline silicon is deposited over the oxide 28 and into the hole 27, and patterned by photolithographic steps to leave the bit line 15, transistor and contact 18. Since the transistor 10 is to be created in this layer 35, it may be preferable to subject the layer to laser anealing or the like to crystallize the material, resulting in better transistor characteristics. Layer 35 is doped with material of opposite impurity-type than that of capacitor region 23. The layer 35 is thermally oxidized at this point to create the gate oxide coating 22 over the entire surface. A masking material such as silicon nitride is now applied over the oxide 22, then patterned by photolithography to leave only a strip mask crossing the channel area 14 where the gate 21 is to be later formed. The exposed oxide 22 is etched away, then the polysilicon 35 is doped with phosphorous or other material of similar impurity-type as that of capacitor region 23 and is silicided by depositing a material such as titanium and heating to react the titanium with the silicon to create titanium silicide where not masked by nitride. This is needed to make the bit lines and contact areas of low resistance. The channel of the transistor is protected by the silicon nitride.

As seen in FIGS. 1 and 3a–3c, the fabrication is completed by depositing the oxide 38, removing the oxide and nitride from the gate area of the transistor, then depositing metal over the top surface and patterning to leave the word line, 20 and gate 21.

The area occupied by one cell in an array of cells made according to the invention is about 2.5×4 microns, so the cell size fits within the requirements for feaqsible manufacture of 1-Mbit DRAMs using 1 microns as a minimum width.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A dynamic read/write memory cell formed in a face of a semiconductor body, comprising:
   a capacitor in a trench in said face, that capacitor having a lower plate defined by a doped region at the surface of the sidewalls and bottom of the trench, having a capacitor dielectric on the side walls and bottom of the trench, and an upper plate defined by a conductive material substantially filling the trench, an insulator overlying said conductive material, and means for connecting the upper plate to a reference potential,
   an access transistor in the form of an MOS field-effect device overlying said insulator, said device including a channel region directly above said trench and including source and drain regions on opposite ends of said channel region overlying said insulator, a bit line extending along said face overlying said insulator and connected to said drain region, a word line extending along said face and forming a gate for the transistor above said channel region, and ohmic contact means coupling the source region to said doped region of the capacitor, wherein said source and drain regions and said doped region of said capacitor are doped with materials having similar impurity-type.

2. A memory cell according to claim 1 wherein said semiconductor body is silicon and said channel region is silicon.

3. A memory cell according to claim 2, wherein said conductive material is polycrystalline silicon, and said means for connecting said upper plate to reference potential is a layer of polycrystalline silicon extending along said face.

4. A memory cell according to claim 3 wherein said bit line and said source and drain regions are silicided.

5. A memory cell according to claim 4 wherein said contact means is in a hole in said layer and in said insulator, and includes a doped region of said face adjacent said trench.

6. A dynamic read/write memory cell formed in a face of a semiconductor body, comprising:
   a capacitor in a recess formed in said face, the capacitor having a lower electrode defined by a doped region in all surfaces of the recess, having a capacitor dielectric coating on all surfaces of the recess, and an upper electrode defined by a conductive material within the recess, an insulator overlying said conductive material, and means for connecting the upper electrode to reference potential,
   an access transistor in the form of a MOS field-effect device located above the recess overlying said insulator, said device including a channel region in a semiconductor layer directly above the recess and including source and drain regions on opposite ends of said channel region overlying said insulator, a bit line extending along said face overlying said insulator and connected to said drain region, a word line extending along said face and forming a gate for the transistor above said channel region, and ohmic contact means directly connecting the source region to said face at said doped region of the capacitor, wherein said source and drain regions are doped with a material having similar impurity-type as the material used to dope said doped region of said capacitor.

7. A memory cell according to claim 6, wherein said semiconductor body is silicon and said channel region is silicon.

8. A memory cell according to claim 7, wherein said conductive material is polycrystalline silicon, and said means connecting said upper plate to reference potential is a layer of polycrystalline silicon extending along said face.

9. A memory cell according to claim 6, wherein said contact means is in a hole in said layer and in said insulator, and includes a doped region of said face adjacent said trench.

10. A memory cell according to claim 1, wherein said word line extends over said source and drain regions of said access transistor.

11. A memory cell according to claim 10, wherein said access transistor further comprises:
a gate insulator disposed between said word line and said source, drain and channel regions of said access transistor, said gate insulator being thinner over said channel region than over said source and drain regions.

12. A memory cell according to claim 11, wherein said source and drain regions of said access transistor are silicided.

13. A memory cell according to claim 10, wherein said source and drain regions of said access transistor are silicided.

14. A memory cell according to claim 6, wherein said word line extends over said source and drain regions of said access transistor.

15. A memory cell according to claim 14, wherein said access transistor further comprising:
a gate insulator disposed between said word line and said source, drain and channel regions of said access transistor, said gate insulator being thinner over said channel region than over said source and drain regions.

16. A memory cell according to claim 15, wherein said source and drain regions of said access transistor are silicided.

17. A memory cell according to claim 14, wherein said source and drain regions of said access transistor are silicided.

18. An improvement to an integrated circuit structure having a field effect transistor over a capacitor groove in which said capacitor covers the entire surface of said groove, the improvement comprising a dynamic read/write memory cell formed in a face of a semiconductor body, further comprising:
a capacitor in a trench etched into said face, the capacitor having a lower plate defined by a doped region in the surface of the sidewalls and bottom of the trench, having a capacitor dielectric coating on the sidewalls and bottom of the trench, and an upper plate defined by a conductive material substantially filling the trench, an insulator overlying said conductive material, and means for connection the upper plate to reference potential,
an access transistor in the form of a MOS field-effect device located above the trench overlying said insulator, said device including a channel region directly above said trench and including source and drain regions on opposite ends of said channel region overlying said insulator, and connected to said drain region, a word line extending along said face and forming a gate for the transistor above said channel region, and ohmic contact means coupling the source region to said doped region of the capacitor, wherein said source and drain regions and said doped region of said capacitor are doped with materials having similar impurity-type.

19. A memory cell according to claim 18, wherein said semiconductor body is silicon and said channel region is silicon.

20. A memory cell according to claim 19, wherein said conductive material is polycrystalline silicon, and said means for connecting said upper plate to reference potential is a layer of polycrystalline silicon extending along said face.

21. A memory cell according to claim 20, wherein said bit line and said source and drain regions are silicided.

22. A memory cell according to claim 21, wherein said contact means is in a hole in said layer and in said insulator, and includes a doped region of said face adjacent said trench.

23. A memory cell according to claim 18, wherein said word line extends over said source and drain regions of said access transistor.

24. A memory cell according to claim 23, wherein said access transistor further comprises:
a gate insulator disposed between said word line and said source, drain and channel regions of said access transistor, said gate insulator being thinner over said channel region than over said source and drain regions.

25. A memory cell according to claim 24, wherein said source and drain regions of said access transistor are silicided.

26. A memory cell according to claim 23, wherein said source and drain regions of said access transistor are silicided.

27. An improvement to an integrated circuit structure having a field-effect transistor over a capacitor groove, in which said capacitor covers the entire surface of said groove, the improvement comprising a dynamic read/write memory cell formed in a face of a semiconductor body, further comprising:
a capacitor in a recess formed in said face, the capacitor having a lower electrode defined by a doped region in all surfaces of the recess, and an upper electrode defined by a conductive material within the recess, an insulator overlying said conductive material, and means for connecting the upper electrode to reference potential,
an access transistor in the form of a MOS field-effect device located above the recess overlying said insulator, said device including a channel region in a semiconductor layer directly above the recess and including source and drain regions on opposite ends of said channel region overlying said insulator, a bit line extending along said face overlying said insulator and connected to said drain region, a word line extending along said face and forming a gate for the transistor above said channel region, and ohmic contact means directly connecting the source region to said face at said doped region of the capacitor, wherein said source and drain regions are doped with a material having similar impurity-type as the material used to dope said region of said capacitor.

28. A memory cell according to claim 27, wherein said semiconductor body is silicon and said channel region is silicon.

29. A memory cell according to claim 28, wherein said conductive material is polycrystalline silicon, and said means connecting said upper plate to reference potential is a layer of polycrystalline silicon extending along said face.

30. A memory cell according to claim 27 wherein said contact means is in a hole in said layer and in said insulator, and includes a doped region of said face adjacent said trench.

31. A memory cell according to claim 27, wherein said word line extends over said source and drain regions of said access transistor.

32. A memory cell according to claim 31, wherein said access transistor further comprises:
a gate insulator disposed between said word line and said source, drain and channel regions of said access transistor, said gate insulator being thinner over said channel region than over said source and drain regions.

33. A memory cell according to claim 32, wherein said source and drain regions of said access transistor are silicided.

34. A memory cell according to claim 31, wherein said source and drain regions of said access transistor are silicided.

* * * * *